(12) United States Patent
Culbertson, II et al.

(10) Patent No.: US 12,027,032 B1
(45) Date of Patent: Jul. 2, 2024

(54) SYSTEMS AND METHODS FOR DETECTING PHYSICAL PRESENCE WHILE PROVIDING PRIVACY

(71) Applicant: United Services Automobile Association (USAA), San Antonio, TX (US)

(72) Inventors: William Preston Culbertson, II, Plant City, FL (US); Gregory David Hansen, Fuquay Varina, NC (US); Mark Anthony Lopez, Helotes, TX (US); Will Kerns Maney, New York City, NY (US); Keegan Patrick Hayes, Whitestown, IN (US); Steven Michael Bernstein, San Antonio, TX (US)

(73) Assignee: United Services Automobile Association (USAA), San Antonio, TX (US)

( * ) Notice: Subject to any disclaimer, the term of this patent is extended or adjusted under 35 U.S.C. 154(b) by 42 days.

(21) Appl. No.: 17/732,054

(22) Filed: Apr. 28, 2022

(51) Int. Cl.
*G08B 21/22* (2006.01)
*H10N 30/30* (2023.01)

(52) U.S. Cl.
CPC ........... *G08B 21/22* (2013.01); *H10N 30/302* (2023.02)

(58) Field of Classification Search
USPC .... 340/573.1, 539.1, 469, 477, 515, 539.12, 340/539.3, 568, 576, 586, 625, 636.1, 340/636.11
See application file for complete search history.

(56) References Cited

U.S. PATENT DOCUMENTS

| | | | |
|---|---|---|---|
| 11,093,554 B2 * | 8/2021 | Rexach | A61B 5/16 |
| 2003/0042828 A1 * | 3/2003 | Bonin | A47B 67/02 220/87.1 |
| 2003/0111006 A1 * | 6/2003 | DuBarry | G09F 9/00 116/308 |
| 2019/0090056 A1 * | 3/2019 | Rexach | G06F 1/3231 |
| 2020/0149260 A1 * | 5/2020 | Pamula | H01M 10/46 |

* cited by examiner

*Primary Examiner* — Daniel Previl
(74) *Attorney, Agent, or Firm* — Fletcher Yoder, P.C.

(57) ABSTRACT

A sensitive area activity monitoring system is provided. A non-intrusive sensor that does not provide image, video, or audio data is used to capture data in a sensitive area that is associated with an activity. The sensor data is logged and provided to a downstream service tasked with personalizing the service based upon the logged data.

20 Claims, 17 Drawing Sheets

US 12,027,032 B1

SYSTEMS AND METHODS FOR DETECTING PHYSICAL PRESENCE WHILE PROVIDING PRIVACY

BACKGROUND

This section is intended to introduce the reader to various aspects of art that may be related to various aspects of the present disclosure, which are described and/or claimed below. This discussion is believed to help provide the reader with background information to facilitate a better understanding of the various aspects of the present disclosure. Accordingly, it is understood that these statements are to be read in this light, and not as admissions of prior art.

In an increasingly digital world, where more information about customers may become available, personalization of services may increasingly become normative. Unfortunately, due to the private nature of certain environments, such as bathrooms, there may be a lack of awareness of certain customers' activities. This may hinder future personalization of services, resulting in reduced feature growth in digital services that could be impacted by becoming aware off customer activities in these private environments.

SUMMARY

Certain embodiments commensurate in scope with the present disclosure are summarized below. These embodiments are not intended to limit the scope of the disclosure, but rather these embodiments are intended only to provide a brief summary of possible forms of present embodiments. Indeed, present embodiments may encompass a variety of forms that may be similar to or different from the embodiments set forth below.

Provided herein are systems and techniques for identifying customer activities in private environments while retaining a level of privacy not afforded by certain types of sensors. In particular, the current systems and techniques provide insight into customer activities without the use of video capture and/or audio capture devices that may impede the privacy desired in such embodiments.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment"

or "an embodiment" of the present disclosure are not intended to be interpreted as excluding the existence of additional embodiments that also incorporate the recited features.

As noted above, certain environments (e.g., bathrooms) are sensitive areas where more privacy may be desirable than in other less-sensitive areas. However, it may still be beneficial to understand activities that occur in these sensitive environments, while limiting use of certain types of sensors (e.g., cameras) that may potentially reduce privacy by capturing/utilizing potentially more information than other techniques for identifying activities within these environments. Accordingly, devices and techniques are provided herein to identify sensitive environment activities while limiting intrusion in these sensitive areas.

Figure 1:
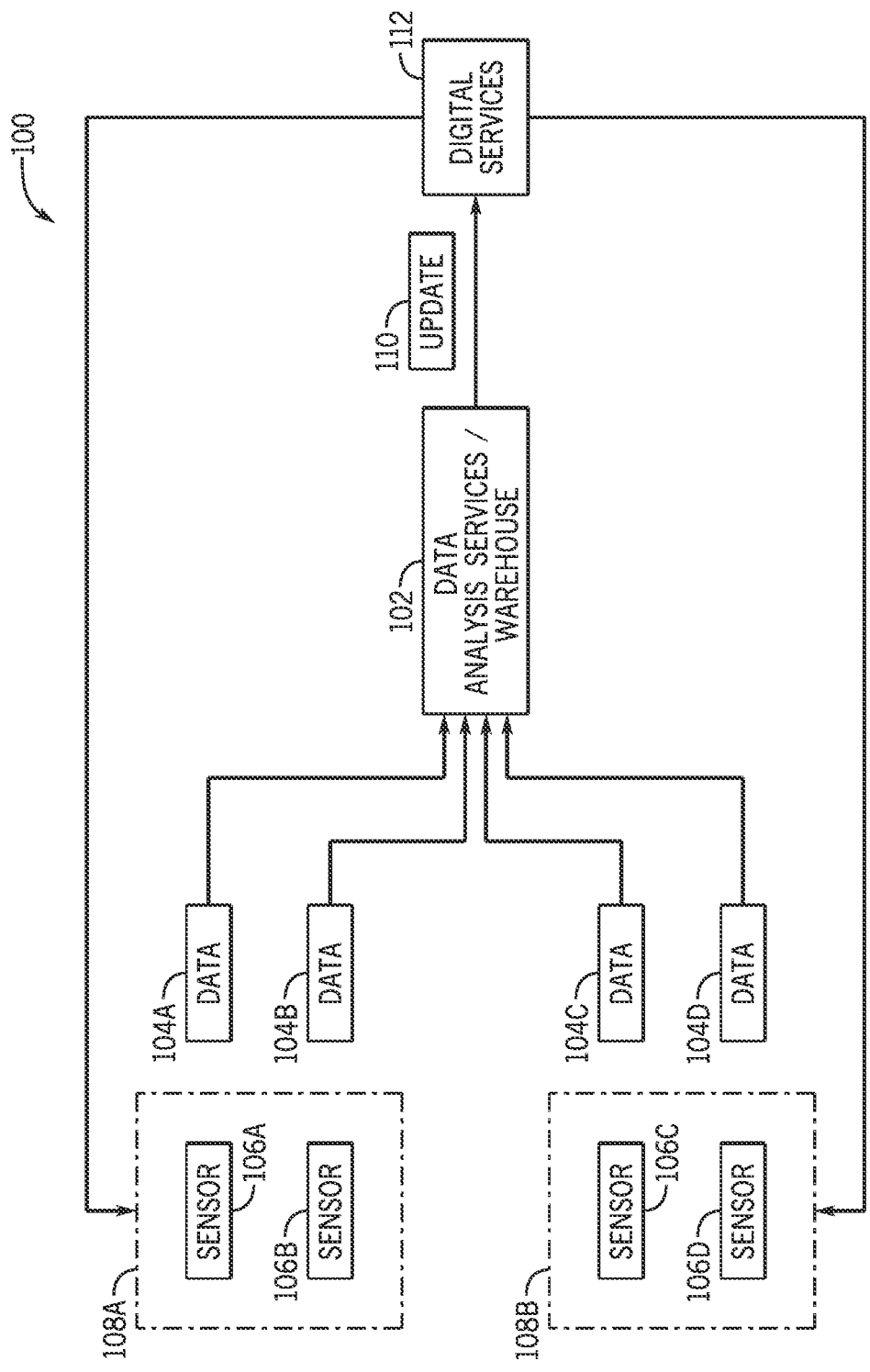
FIG. 1 illustrates a schematic diagram of a customer activity tracking system, in accordance with embodiments described herein.

With the foregoing in mind, FIG. 1 illustrates a schematic diagram of a customer activity tracking system 100, in accordance with embodiments described herein. As illustrated, the customer activity tracking system 100 includes data analysis service(s)/warehouse 102, which receives data from sensitive environments. For example, here, sensor data 104A and 104B is provided by sensors 106A and 106B, respectively. The sensors 106A and 106B are disposed in sensitive area 108A and record information in an un-intrusive manner, by refraining from capturing video, imaging, and/or audio within the sensitive area 108A. The data analysis service(s)/warehouse 102 may receive sensor data from a number of sensitive environments, which may be useful in aggregating or otherwise inferring information across different environments. For example, here, data analysis service(s)/warehouse 102 receives sensor data 104C and 104D from sensors 106C and 106D, respectively. The sensors 106C and 106D are in sensitive area 108B, which may be different than sensitive area 108A. The areas 108A and 108B may be different rooms in a common property and/or may be different areas of different properties. In some embodiments, data from similar areas (e.g., bathrooms) may be aggregated and/or associated to derive information from particular types of areas.

The data analysis service(s)/warehouse 102 may provide one or more update(s) 110 to one or more digital service(s) 112 that indicate activities and/or patterns of activities identified by the data analysis service(s)/warehouse 102. The data analysis service(s)/warehouse 102 may act as a gatekeeper for private information. For example, data analysis service(s)/warehouse 102 may identify whether sensitive sensor data is received and block access to this data by downstream digital services 112. In this manner, data analysis service(s)/warehouse 102 may act as a trusted intermediary that provides digital services 112 only with the updates 110 that it needs to personalized digital services 112. In some embodiments, data analysis service(s)/warehouse 102 may make this determination based upon the personalized digital services that the digital services 112 purport to provide. This may enable the digital service(s) 112 to provide personalized service offerings while retaining privacy within the areas 108A and 108B. For example, as illustrated, services are provided to occupants of the areas 108A and/or 108B.

Substance Access and Use

Turning now to more detailed embodiments, the following discussion is directed to substance access and/or use tracking. As may be appreciated, substances such as medicines are oftentimes stored in bathrooms or other sensitive areas. The following devices and techniques make use of less-obtrusive mechanisms to track substance access and/or use, which may be used to provide personalized digital services.

Figure 2:
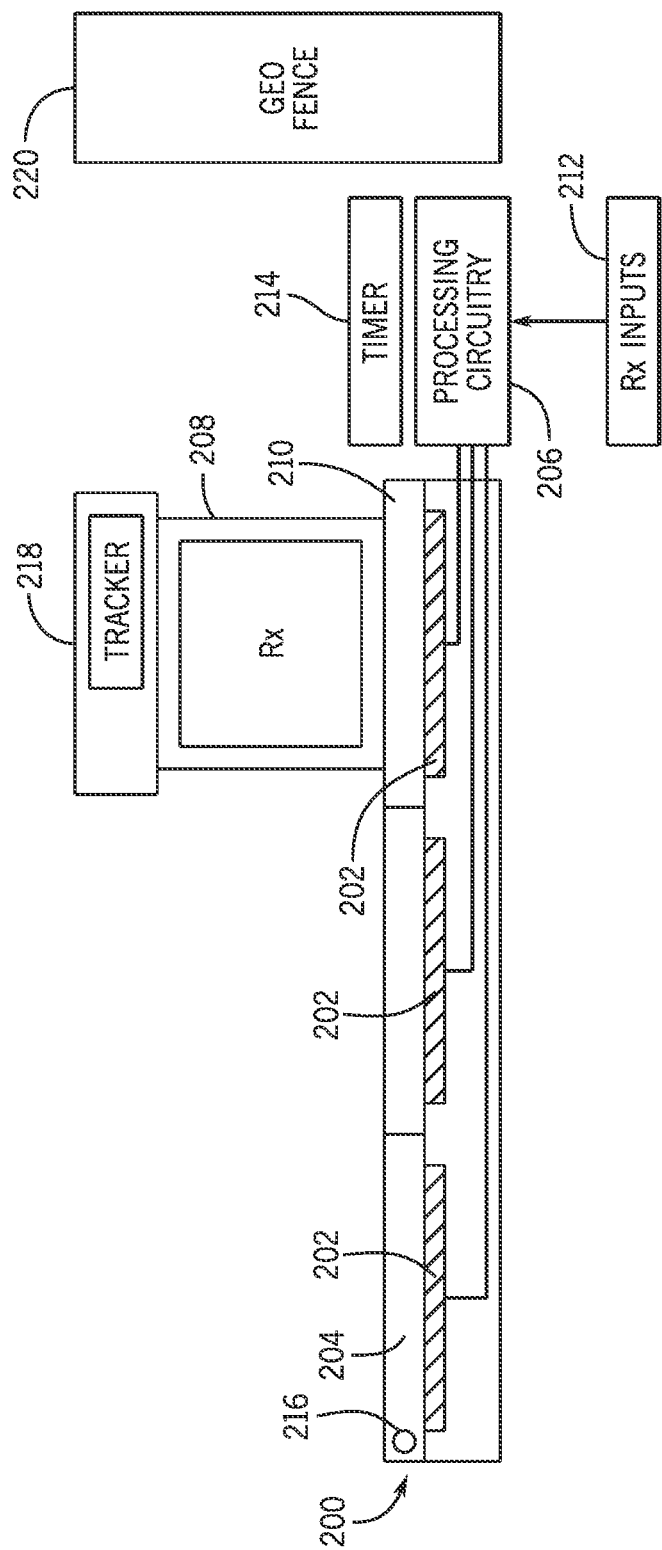
FIG. 2 illustrates a schematic diagram of smart medicine cabinet shelf, in accordance with embodiments described herein.

FIG. 2 illustrates a schematic diagram of smart medicine cabinet shelf 200, in accordance with embodiments described herein. The shelf 200 includes pressure plates 202 that can sense pressure on corresponding portions of the shelf substrate 204. Processing circuitry 206 may receive signals from the pressure plates 202 indicating weight changes at the portions of the shelf substrate 204. These weight changes may indicate access to substances contained at the portions of the shelf substrate 204. For example, as illustrated, a medicine bottle 208 is placed on portion 210 of the shelf substrate 204. The corresponding pressure plate 202 may send a signal based upon the increased weight caused by placing the medicine bottle 208, which may indicate that something is being stored at portion 210.

It may be desirable to track specific characteristics of the items stored at the portions of the shelf substrate 204. For example, by tracking certain features, many activities may be discerned. The processing circuitry 206 may receive a prescription and/or medicine description input 212 which may indicate an amount (e.g., number of pills) contained at the portion 210. In some embodiments, a weight of each pill may be provided as part of the input 212. In other embodiments, the processing circuitry 206 may prompt an operator to remove a certain number of pills and calculate a pill weight based upon the difference in weight observed by the pressure plate 202 divided by the number of pills asked to be removed. The pill weight may be used in conjunction with other data to identify whether consistent access to the pills is observed. In some embodiments, when the input 212 includes an indication of particular usage recommendations, a timer 214 can be used in conjunction with the pressure plate 202 signals to identify whether the medicine bottle 208 is accessed at the proper times indicated by the recommended usage. For example, the if the recommended usage is "twice daily, once in morning, once in evening" the processing circuitry can determine whether this recommended usage is being followed based upon when the pressure plate signals indicate the medicine bottle 208 has been moved from the portion of the shelf substrate 204, as indicated by the timer 214. In some embodiments, even more detail may be gleaned when the pill weight is known. For example, when the pill weight is known, it may be discerned whether the recommended dosages are being observed. Indeed, when the medicine bottle 208 is placed back on the portion of the shelf substrate 204, a differential of weight from the prior placement may be obtained. The differential may be divided by the pill weight to obtain a number of pills likely removed from the medicine bottle 208. This may be compared with a provided recommended dosage (e.g., provided by the input 212) to identify whether the recommended dosage is being observed.

In some embodiments, a sensor 216 may be in communication with a tracking sensor 218 of the medicine bottle 208. Upon registration of the medicine bottle 208 to the shelf 200, the sensor 216 may periodically communicate with the tracking sensor 218 to confirm that the medicine bottle 208 is indeed still on the shelf. When such a communication cannot be established, the processing circuitry 206 may identify that the medicine bottle 208 is no longer on the shelf 200. This could also be done by simply identifying a baseline shelf 200 weight and identifying, via the pressure plates 202 that the portion holding the medicine bottle 208 has returned within a threshold of the baseline (e.g., which may, in some cases, encapsulate a weight including an empty medicine bottle 208) for a certain period of time indicative of long-term removal from the shelf 200. The tracking sensor 218 could also include circuitry (e.g., RFID) that, when in proximity to a geo-fence sensor 220 (e.g., an RFID reader), causes communication of data between the tracking sensor 218 and the geo-fence sensor 220 indicating that the medicine bottle 208 is near and/or leaving a permitted geo-fence boundary.

While the provided discussion uses the example of pills in the medicine bottle 208, this is not intended to limit the type of substance that can make use of the described device and techniques. Indeed, liquids and/or other substances may be tracked using similar techniques to those described herein.

Figure 4A:
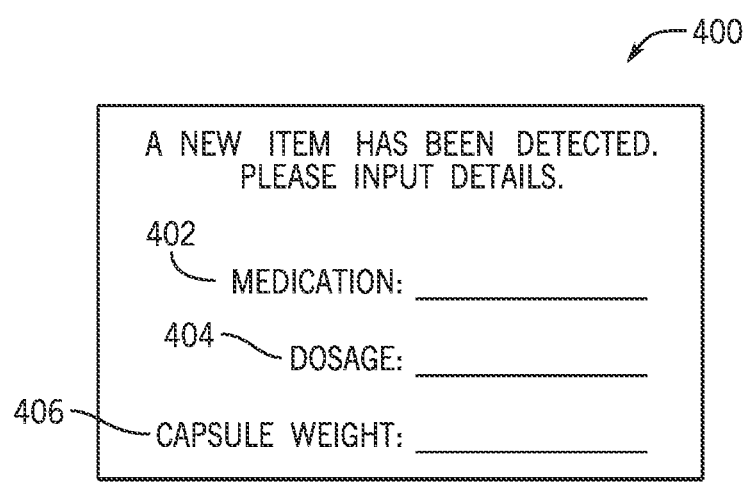
FIG. 4A illustrates a graphical user interface for medication registration in accordance with embodiments described herein.

As will be discussed in more detail below with respect to FIGS. 4A-4C, this tracking activity information may be used to provide personalized digital services. For example, notifications of unauthorized access, improper access, etc. may be provided to users, which may provide added safety and security for users.

Figure 3:
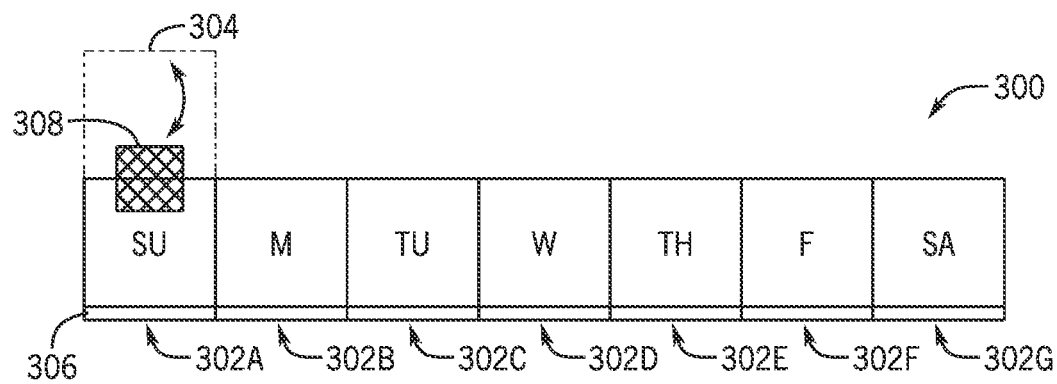
FIG. 3 illustrates a schematic diagram of a smart pill box, in accordance with embodiments described herein.

FIG. 3 illustrates a schematic diagram of a smart pill box 300, in accordance with embodiments described herein. Like the smart shelf 200 of FIG. 2, the smart pill box 300 may track access to substances. The pill box 300 may include substance compartments 302A-G for each day of the week, which may be accessed by opening a corresponding lid 304. The lid may include a compression fastener 306 that when compressed provides a signal to processing circuitry of the pill box 300 to indicate access to a corresponding compartment (e.g., 302A). In some embodiments, a piezo sensor 308 may provide a signal to the processing circuitry of the pill box 300 indicating that the lid 304 corresponding to a particular day has been actuated. As may be appreciated, the piezo sensor 308 may be disposed at a hinge of the lid 304, as, depending on the type of piezo sensor 308, a compression action and/or expansion action caused by actuating the lid 304 may cause the piezo sensor 308 to generate a signal for provision to the processing circuitry.

The shelf 200 and the pill box 300 may include communications circuitry that enables provision of generated signals to a data analysis service/warehouse 102, which may discern activities indicated by the generated signals in lieu of the processing circuitry. This may be beneficial as the processing circuitry embedded in the shelf 200 and/or pill box 300 may be low power to reduce costs and/or footprints within the shelf 200 and/or pill box 300.

The data analysis service/warehouse 102 may provide activity updates 110 to digital services 112, which may provide personalized services based upon the activity updates 110. One such service may be a proper medication tracking service. As mentioned above, such a service may make use of medication registration. FIG. 4A illustrates a graphical user interface (GUI) 400 for medication registration in accordance with embodiments described herein. The GUI 400 prompts for particular information useful for tracking proper medicine use. For example, here, a medication type prompt 402, a medication dosage prompt 404, and a capsule weight prompt 406 are provided to generate the input 212 of FIG. 2.

Figure 4B:
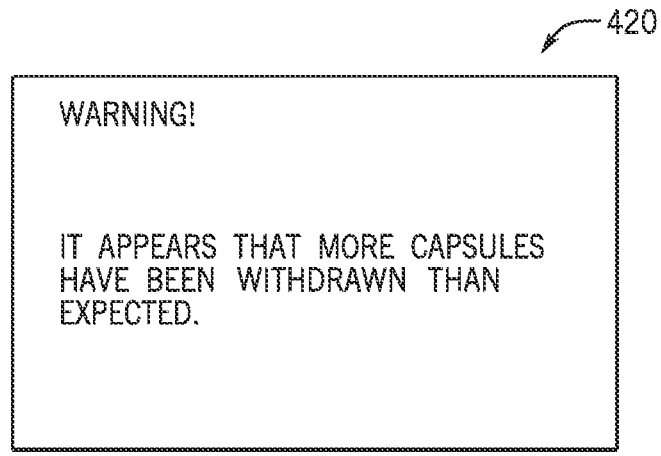
FIGS. 4B-4D display resulting graphical user interface notifications that may occur when unexpected dosage withdrawals are detected, in accordance with embodiments described herein.
Figure 4C:
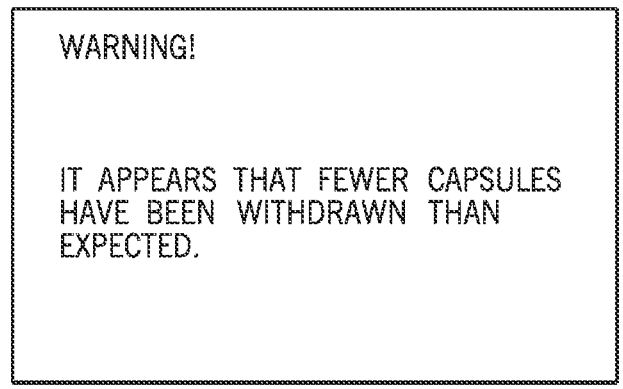
Figure 4D:
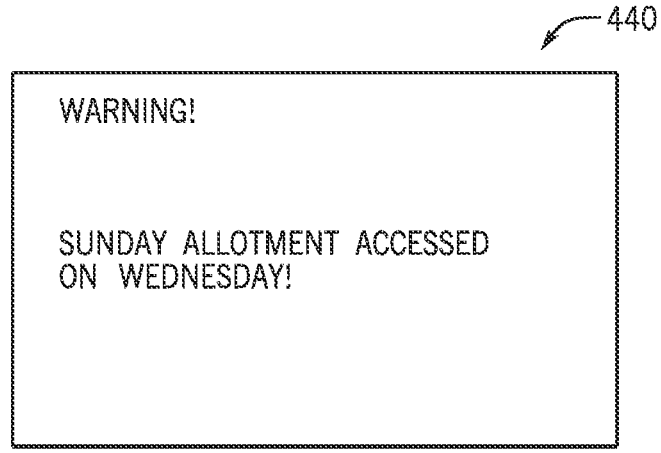

FIGS. 4B-4D display resulting graphical user interface notifications that may occur when unexpected dosage withdrawals are detected, in accordance with embodiments described herein. FIG. 4B provides a notice 420 indicating that more capsules have been withdrawn than expected. For example, based upon a differential in weight between a pre-capsule removal and a post-capsule removal and a capsule weight, a number of withdrawn capsules may be estimated (e.g., by dividing the differential weight by the capsule weight). This estimate may be compared with the dosage provided in prompt 404 to determine whether the expected amount of capsules has been withdrawn. If not, the notice 420 may be pushed to an electronic device and display in a GUI. Otherwise, when the expected amount is withdrawn, the notice is refrained from push/display.

FIG. 4C illustrates a notice 430 indicating that a lesser than expected amount has been withdrawn. This may be identified in a similar manner to an excess withdraw, as described above. The notice 430 may be pushed/displayed when an estimated amount of withdrawal is less than the indicated dosage amount. Otherwise, the notice 430 may be refrained from push/display.

FIG. 4D illustrates a notice 440 indicating that a pill allotment intended for a first day was accessed on a different day. This notice 440 may be specific to the pill box 300 and may be pushed/displayed when a compartment (e.g. the Sunday compartment 302A) is accessed on a day other than Sunday (e.g., Wednesday). Otherwise, the notice 440 may be refrained from push/display (e.g., when Sunday's compartment 302A is accessed on Sunday).

Figure 5:
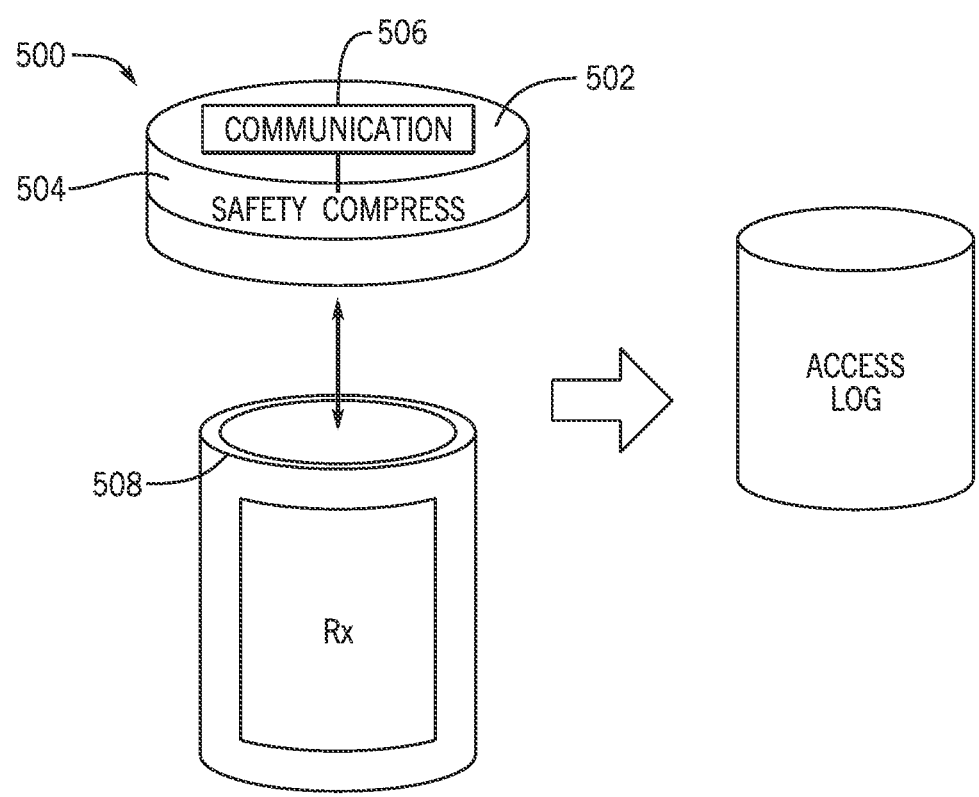
FIG. 5 illustrates a smart medicine bottle that logs access, in accordance with embodiments described herein.

FIG. 5 illustrates a smart medicine bottle 500 that logs access, in accordance with embodiments described herein. The smart medicine bottle 500 includes a top 502 with a safety compression system 504 coupled to communications circuitry 506. The safety compression system 504 causes a signal to be produced when the bottle top 502 is compressed by the lip 508 of the bottle 500. This signal may indicate the compression of the top 502, which may be logged in an access log 510 as an attempt to access the contents of the bottle 500. When polled, the communication circuitry 506 may provide an indication of the logged access attempts stored in the access log 510.

Figure 6:
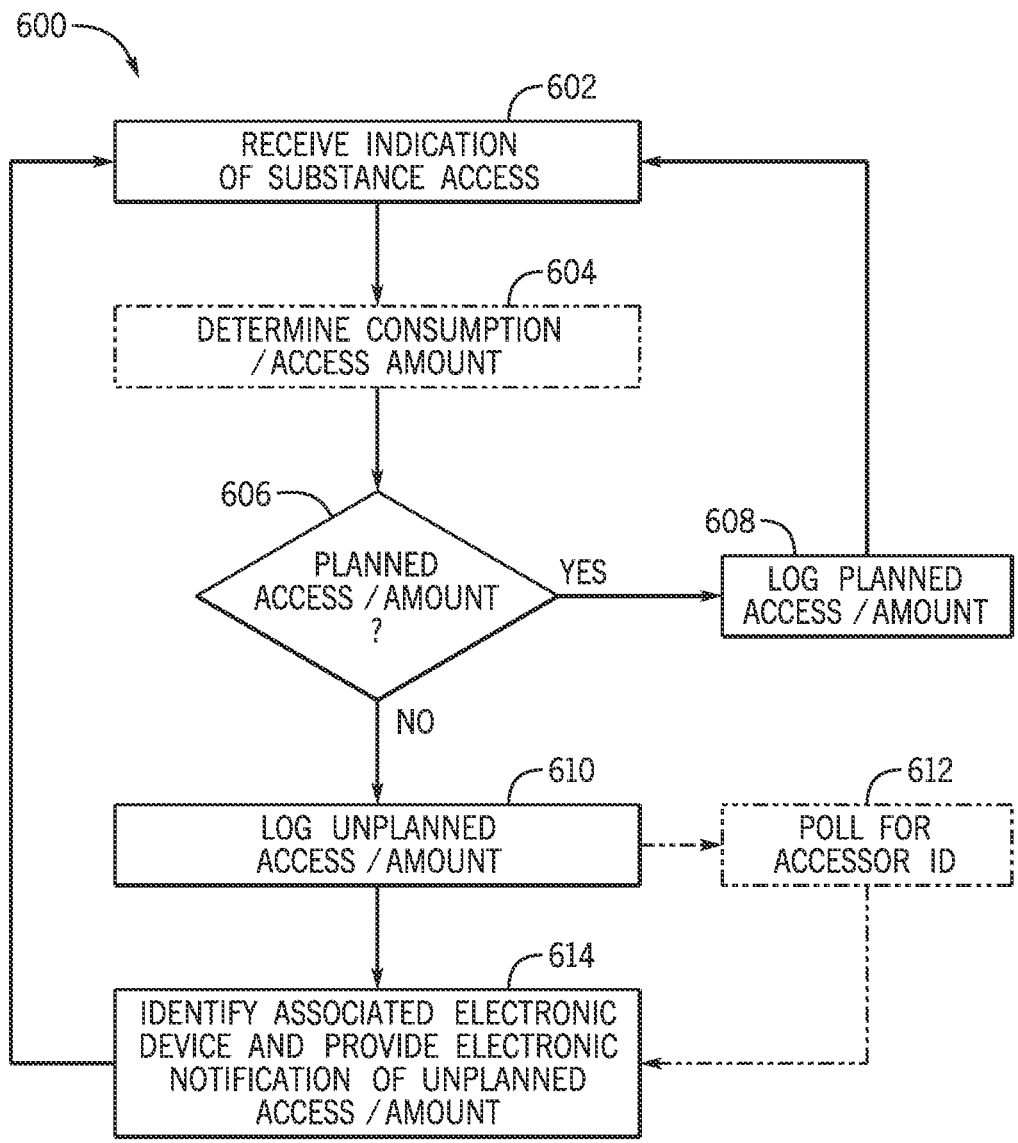
FIG. 6 is a flowchart, illustrating a process for tracking substance access, in accordance with embodiments described herein.

FIG. 6 is a flowchart, illustrating a process 600 for tracking substance access, in accordance with embodiments described herein. The process 600 begins by receiving an indication of substance access (block 602). For example, this indication may be the generated signals discussed in FIG. 2, 3, or 5.

In some embodiments, an amount of consumption/access may be optionally determined (block 604). For example, as described above, a timer may be used to identify how long access occurs. Further, weighting changes may be used to identify an amount of substance that has been accessed/withdrawn.

Next, a determination is made as to whether the access and/or accessed amount is planned (decision block 606). As mentioned above, recommended dosages and other instructions may be provided which can be compared to the access times and/or access amounts to determine whether the access/accessed amount is planned.

If the access and/or accessed amount is planned, the planned access and/or accessed amount can be logged (e.g., in an access log) and the process may periodically repeat (block 608). This log may be useful as it indicates proper medicine usage, which may be used to personalize digital services and/or provide benefits via digital services (e.g., reducing an insurance premium due to proper usage of medicine).

If the access and/or accessed amount is unplanned, the unplanned access and/or access amount may be logged (block 610). Further, in some embodiments, an attempt to poll for accessor identity may be performed (block 612). For example, an electronic pairing request with nearby devices may be broadcasted in an attempt to identify electronic devices in the vicinity of the access. Based upon responses received from the pairing request, an identity of the accessor (or at least the accessor's electronic device) may be identified. In some instances, an actual pairing need not occur. The pairing in such instances is merely used to identify the electronic devices rather than actually pair with them. Identifying the accessor may help ensure that, in cases where there is un-planned access, the unplanned access is ascribed to the proper accessor. In some embodiments, the accessor may be identified by triggering cameras or other sensors at the entrances and/or exits of the sensitive area where the access occurs upon identifying the unplanned access. These sensors may remain on until someone is captured exiting the sensitive area. By activating cameras outside of the sensitive area but at the exit of the sensitive area, privacy may be retained, while still being able to identify the accessor.

A notification of the unplanned access and/or access amount may provided to an identified electronic device (block 614). For example, an electronic device or devices for notification of unplanned access events may be pre-defined during the registration process of the substance. These pre-defined electronic device(s) may be notified with notifications such at those in FIGS. 4B-4D when there are unplanned access and/or access amounts detected.

Dental Hygiene

In some embodiments, digital services may be personalized based upon identified dental hygiene of users. For example, some digital services may incentivize better dental hygiene by providing rewards, lowering insurance premiums, etc. Once again, monitoring dental hygiene occurs in sensitive area where increased privacy may be desired. Accordingly, the devices and techniques provided herein provide non-invasive mechanisms for tracking potential dental hygiene activities.

Figure 7:
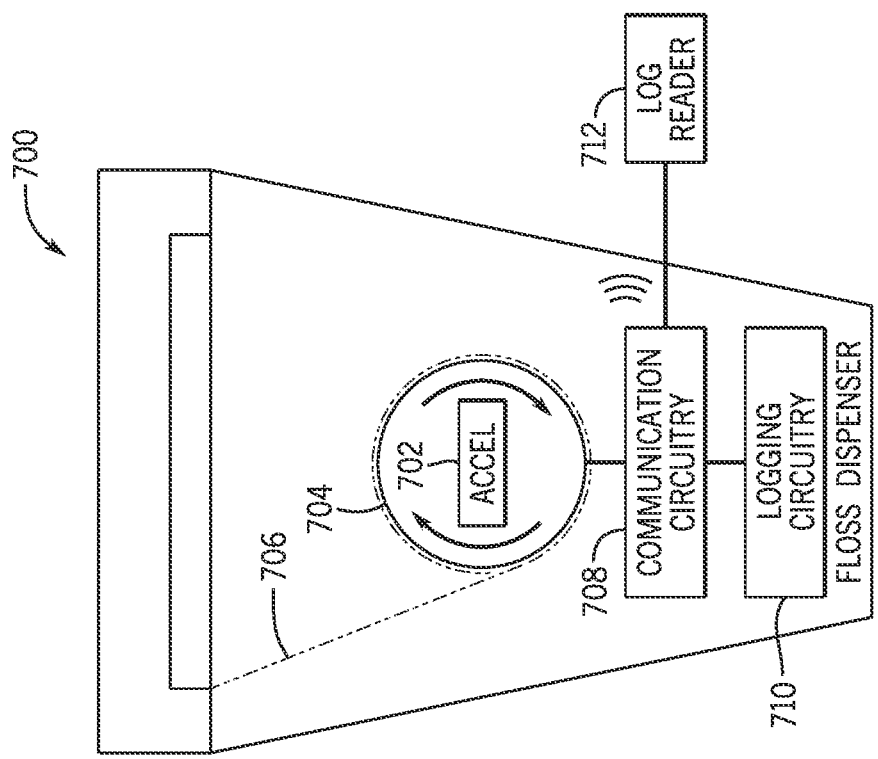
FIG. 7 illustrates a schematic diagram of a smart floss dispenser that uses an accelerometer to log flossing activities, in accordance with embodiments described herein.

FIG. 7 illustrates a schematic diagram of a smart floss dispenser 700 that uses an accelerometer 702 to log flossing activities, in accordance with embodiments described herein. In particular, the accelerometer 702 measures movement of a floss spool 704, which turns as floss 706 is pulled through the dispenser 700. A signal from the accelerometer 702 is provided via the communication circuitry 708 indicating that floss is being pulled. The communications circuitry 708 may provide the signal to logging circuitry 710 (e.g., either local or remote to the dispenser 700), which logs the floss pull. A log reader 712 may, from time to time, be provided the log via the communications circuitry 708, which may provide an indication of flossing activities that may be useful in personalizing digital services based upon flossing activities. In some embodiments, the signal from the accelerometer 702 may be directly logged via the logging circuitry 710 without first being provided to the communications circuitry 708.

Figure 8:
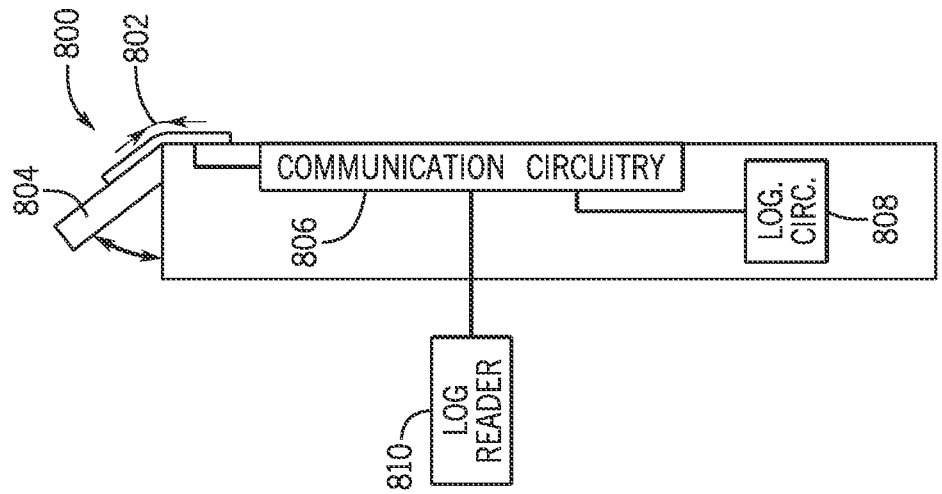
FIG. 8 illustrates a schematic diagram of a floss dispenser that uses a piezo sensor (e.g., piezoelectric and/or piezoresistive sensor) to log flossing activities, in accordance with embodiments described herein.

FIG. 8 illustrates a schematic diagram of a floss dispenser 800 that uses a piezo sensor 802 (e.g., piezoelectric and/or piezoresistive sensor) to log flossing activities, in accordance with embodiments described herein. As illustrated, the piezo sensor 802 is disposed at a hinge of the floss dispenser 800. The piezo sensor 802 is actuated based upon expansion and/or compressions via opening of the lid 804 of the dispenser 800. When actuated, the piezo sensor sends a signal to communications circuitry 806, indicating that dispenser lid 804 has been opened. The communications circuitry 806 may provide the signal to logging circuitry 808 (e.g., either local or remote to the dispenser 800), which logs the lid 804 opening. A log reader 810 may, from time to time, be provided the log via the communications circuitry 806, which may provide an indication of flossing activities that may be useful in personalizing digital services based upon flossing activities. In some embodiments, the signal from the piezo sensor 802 may be directly logged via the logging circuitry 808 without first being provided to the communications circuitry 806.

Figure 9:
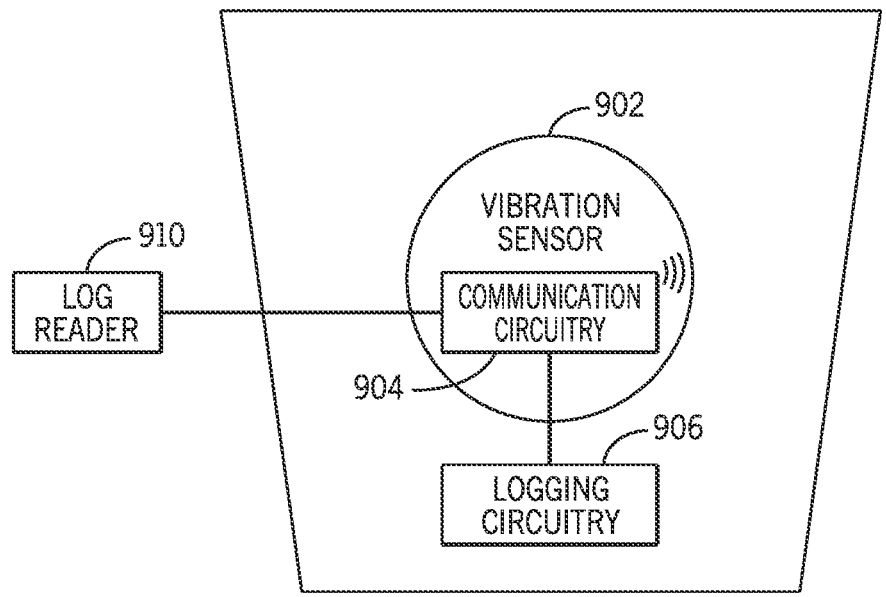
FIG. 9 illustrates a schematic diagram of a floss dispenser that uses a vibration sensor to log flossing activities, in accordance with embodiments described herein.

FIG. 9 illustrates a schematic diagram of a floss dispenser 900 that uses a vibration sensor 902 removably affixed to the dispenser 900 to log flossing activities, in accordance with embodiments described herein. The vibration sensor 902 may be removed and applied to ordinary floss dispensers. The vibration sensor 902 may be affixed in an external portion of the dispenser 900 near the floss spool. The vibrations caused by floss being pulled may generate readings by the vibration sensor 902, causing the vibration sensor 902 to send a signal indicative of a floss pull to communications circuitry 904. The communications circuitry 904 may provide the signal to logging circuitry 906 (e.g., either local or remote to the dispenser 900 and/or the vibration sensor 902), which logs the floss pull. A log reader 910 may, from time to time, be provided the log via the communications circuitry 904, which may provide an indication of flossing activities that may be useful in personalizing digital services based upon flossing activities. In some embodiments, the signal from the vibration sensor 902 may be directly logged via the logging circuitry 906 without first being provided to the communications circuitry 904.

Figure 10:
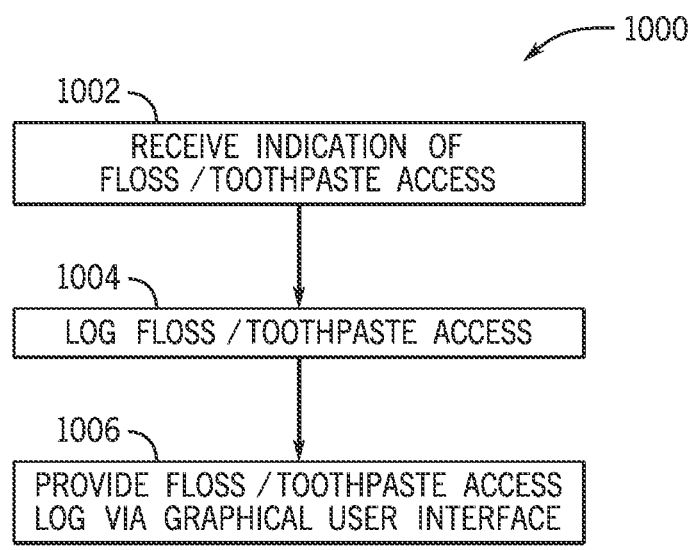
FIG. 10 illustrates a flowchart of a process for logging flossing, in accordance with embodiments described herein.

FIG. 10 illustrates a flowchart of a process 1000 for logging dental hygiene activities, in accordance with embodiments described herein. First, an indication of a floss and/or toothpaste access is received (block 1002). For example, this indication may be via a signal sent from the accelerometer 702 of FIG. 7, the piezo sensor 802 of FIG. 8, the vibration sensor 902 of FIG. 9, tie piezo sensor(s) of FIG. 11, the chemical sensors of FIG. 12, the cartridge actuation sensors of FIG. 13, etc.

The floss and/or toothpaste access is logged (block 1004). For example, a log datastore may be coupled to the sensor providing the signal indicative of the access and the signal may be provided for storage in the datastore via the communicative coupling. In some instances, a timestamp of the indication, a length of the indication, etc. may also be stored in the datastore.

The logged floss and/or toothpaste access may be aggregated over time and an indication of the access may be provided via a graphical user interface (GUI) or as electronic data (e.g., via an application programming interface (API)) (block 1006). For example, access patterns such as patterns of typical access times or lack thereof may be provided via the GUI.

Figure 11:
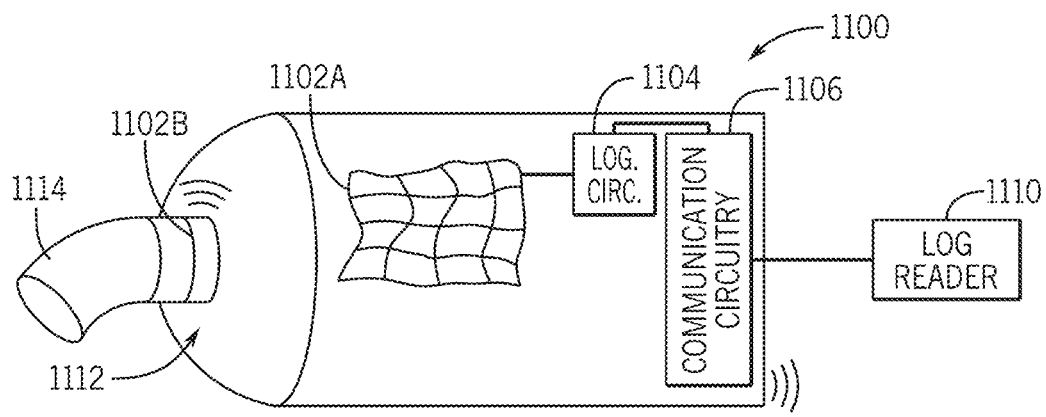
FIG. 11 illustrates a toothpaste tube that uses piezo sensors to detect teeth brushing characteristics, in accordance with embodiments described herein.

FIG. 11 illustrates a toothpaste tube 1100 that uses piezo sensors 1102A and/or 1102B to detect teeth brushing characteristics, in accordance with embodiments described herein. As illustrated, the tube 1100, in some embodiments may include a piezo mesh sensor 1102A that when compressed and/or stretched results in a signal generation and/or provision indicating that toothpaste is being squeezed from the tube 1100. The signal may be provided to logging circuitry 1104 tasked with logging the squeezing. Communication circuitry 1106 may, in some embodiments, be disposed in a rigid portion of the tube, such as the end of the tube and or the tube outlet 1112, where it may be protected by the stiff rigidity of the tube 1100. The communication circuitry 1106 may provide logged squeeze indications to a log reader 1110, which may propagate the logged data for personalization of digital services.

In some embodiments, the tube 1100 may include a piezo sensor 1102B in a toothpaste outlet 1112. As toothpaste 1114 exits the outlet 1112, pressure is exerted on the piezo sensor 1102B, resulting in a signal generation and/or provision to the logging circuitry 1104 for logging.

Figure 12:
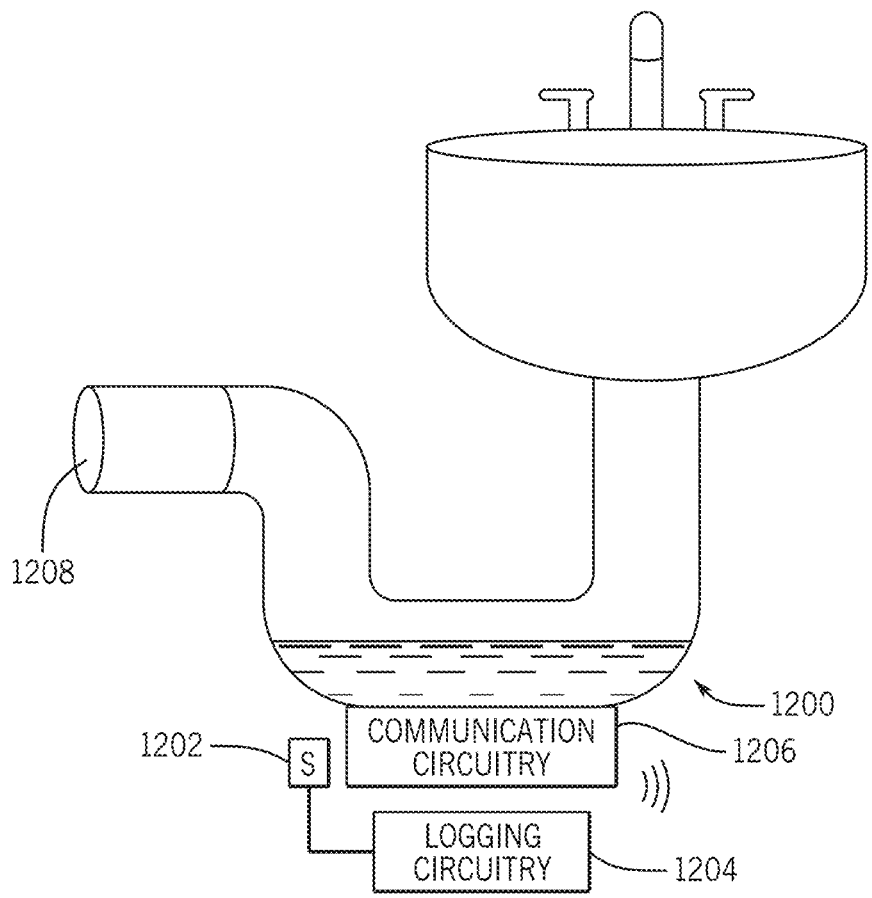
FIG. 12 illustrates a sink P-Trap and/or U-Trap with attached chemical sensor for tracking customer activities, in accordance with embodiments described herein.

FIG. 12 illustrates a sink P-Trap and/or U-Trap 1200 with attached chemical sensor 1202 for tracking activities, in accordance with embodiments described herein. The chemical sensor 1202 may identify the presence of a substance in the trap 1200, which may cause the chemical sensor to generate and/or provide a signal to logging circuitry 1204 for logging of the signal, indicative of a substance being disposed down the drain 1208. Because the substance may reside in the trap 1200 for a period of time, the chemical sensor 1202 may have time to analyze the substance for a chemical makeup. The chemical makeup of the substance may also be indicated in the signal (or an additional signal) provided by the chemical sensor 1202, which may result in the chemical makeup being logged. Communications circuitry 1206 may, from time to time, provide logged data to a log reader that may propagate the logged data for personalized digital services.

Figure 13:
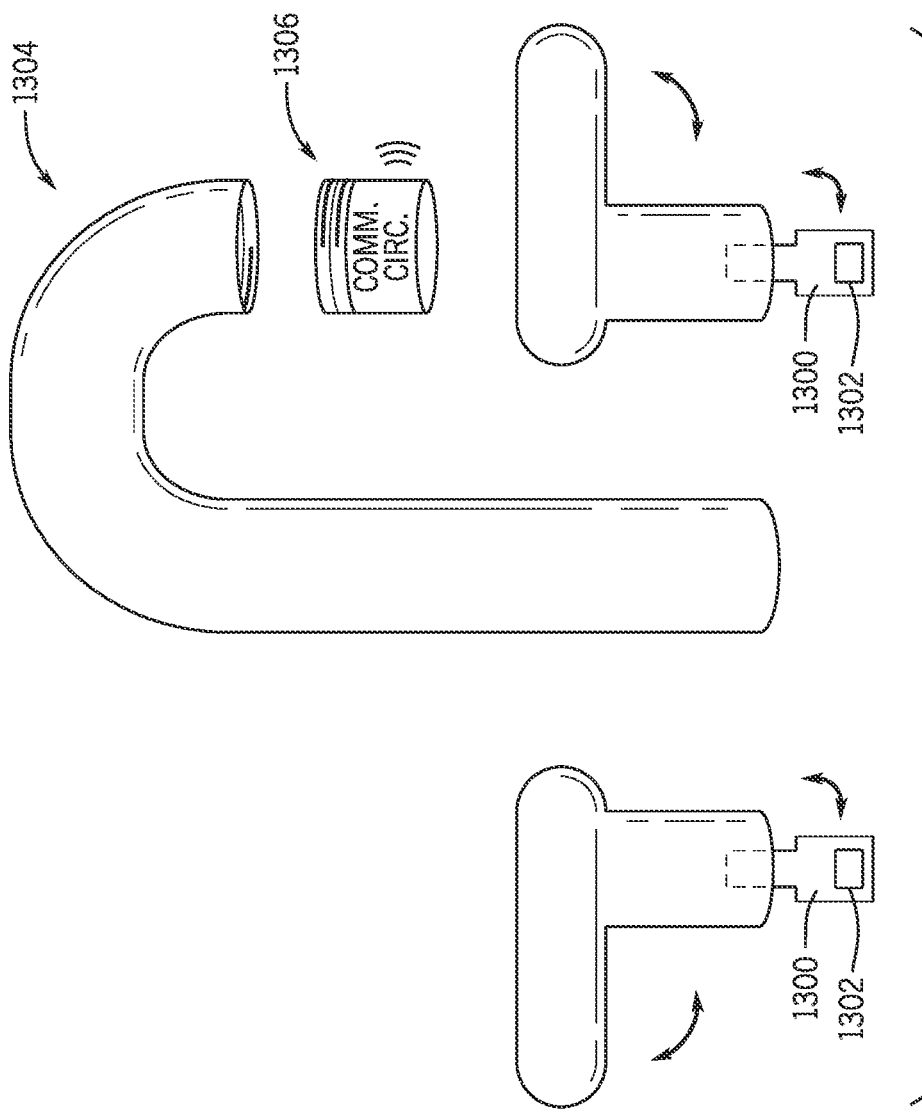
FIG. 13 illustrates a faucet cartridge with attached sensor for tracking customer activities, in accordance with embodiments described herein.

FIG. 13 illustrates faucet cartridges 1300 with attached sensors 1302 for tracking activities, in accordance with embodiments described herein. The sensors 1302 may identify rotation of at least a portion of the cartridge 1300, indicating actuation of the faucet 1304. The sensors 1302 may provide a signal of the actuation to logging circuitry as described herein, which results in logging of the faucet actuation.

In some embodiments, the faucet 1304 may include a nozzle 1306 with a sensor that identifies water flow. The nozzle may be removably attached to the faucet via faucet threads. When water flow is detected, the sensor may provide a signal indicating faucet actuation. Communications circuitry 1308 may provide the signal to logging circuitry for logging of the data, as described herein.

Toilet Usage

Figure 14:
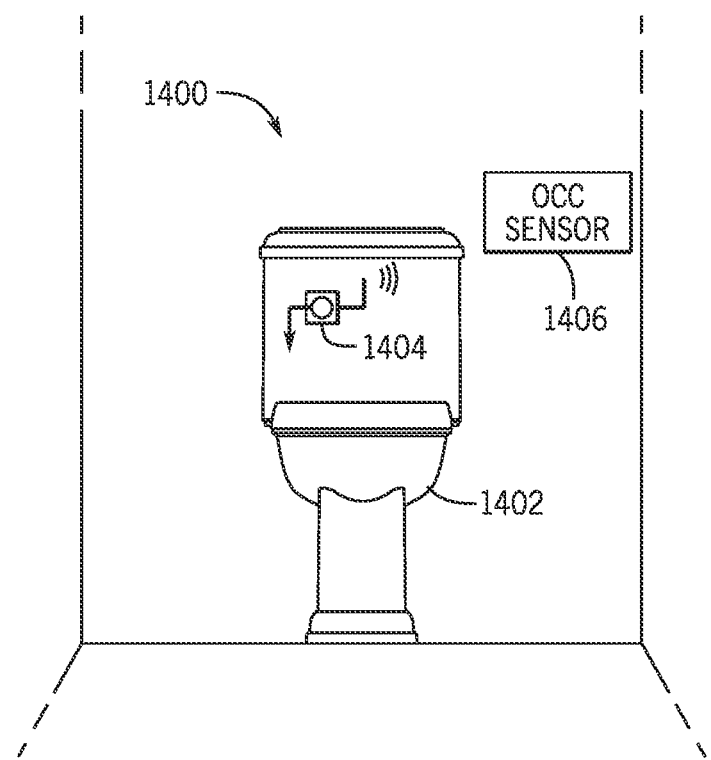
FIG. 14 illustrates a toilet with attached flushing sensor for tracking customer activities, in accordance with embodiments described herein.

Toilet usage may also provide an indication of activities that may be useful for providing personalization of digital services. FIG. 14 illustrates an environment 1400 with a toilet 1402 with attached flushing sensor 1404 for tracking toilet flushing activities, in accordance with embodiments described herein. When actuated, the flushing sensor 1404 generates a signal that may be provided by communications circuitry to a logging circuitry for logging of the signal, indicative of a flush of the toilet 1402. In some embodiments, an occupancy sensor 1406 may be used to log occupancy within the environment 1400, which may be used to identify a duration of time between entering the environment 1400 and flushing (e.g., by subtracting the time of occupancy from the time the signal of the flushing sensor 1404 was generated).

Figure 15:
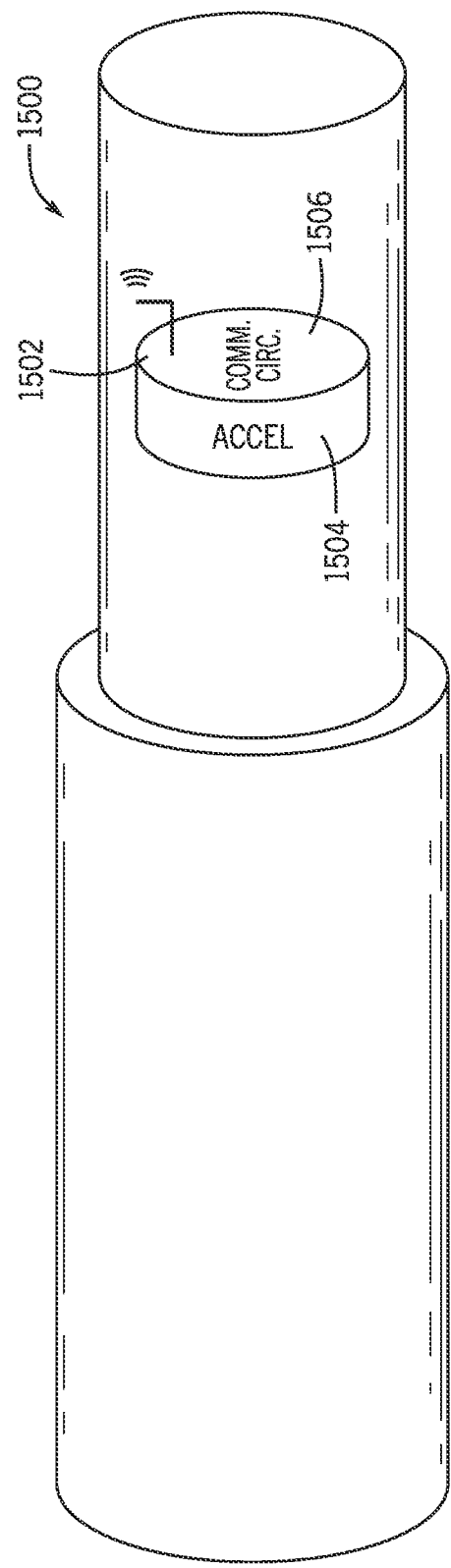
FIG. 15 illustrates a toilet paper roll holder with integrated sensor for tracking customer activities, in accordance with embodiments described herein.

FIG. 15 illustrates a toilet paper roll holder 1500 with integrated sensor 1502 for tracking when toilet paper is used, in accordance with embodiments described herein. The sensor 1502 may include an accelerometer 1504 that actuates when the holder 1500 is rolled. Signals from the accelerometer 1504 may be provided via communications circuitry 1506 to logging circuitry where the signals are logged. The logged signals may be used to discern data regarding toilet usage. For example, based upon the number of rotations, an amount of toilet paper used may be estimated. Further, the actuation may provide an estimate of numbers of uses of the toilet, a duration of time the toilet is used, etc.

Figure 16:
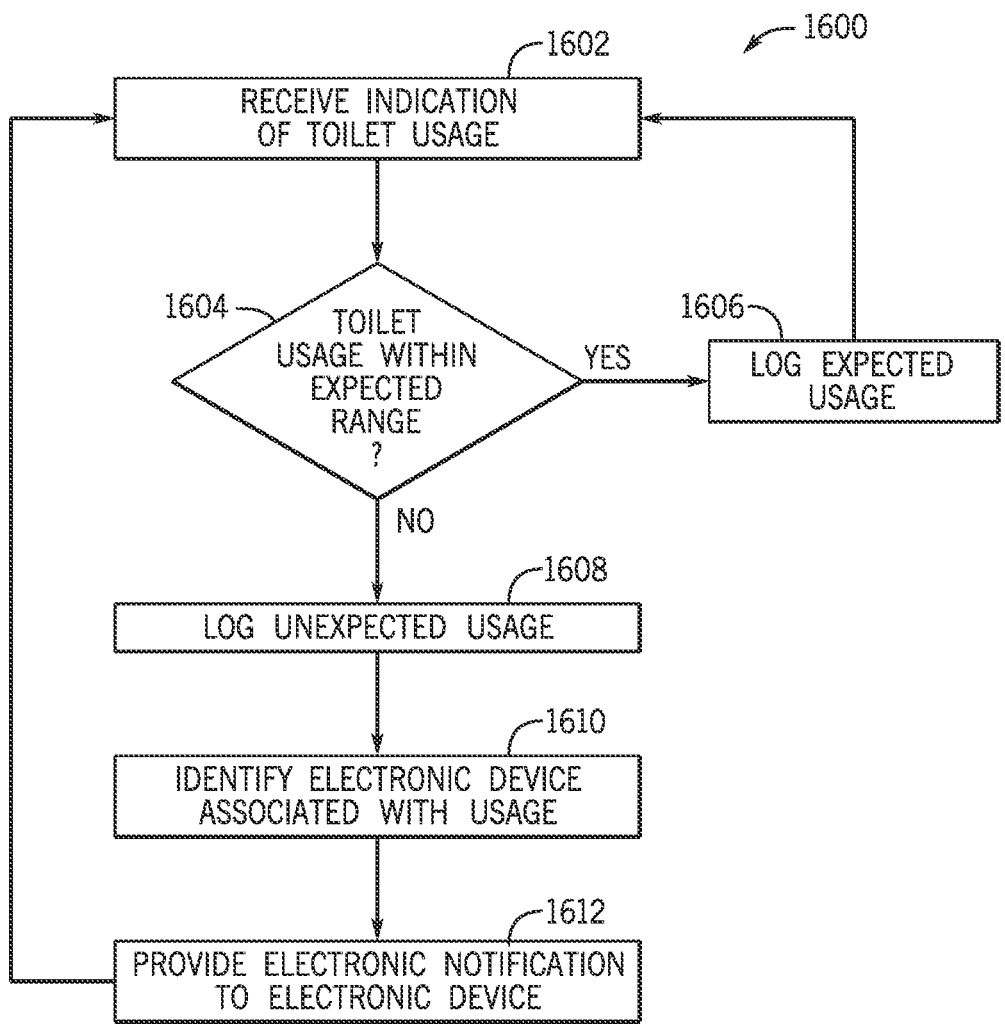
FIG. 16 illustrates a flowchart of a process for tracking customer toilet activities, in accordance with embodiments described herein.

FIG. 16 illustrates a flowchart of a process 1600 for tracking customer toilet activities, in accordance with embodiments described herein. First, an indication of toilet usage is received (block 1602). For example, the indication may be the generated/provided signals of the sensors of FIGS. 14 and/or 15.

A determination is made as to whether the toilet usage is within an expected range (decision block 1604). For example, known demographics about the presumed toilet user may be used to determine threshold usage ranges of toilet usage (e.g., how long a typical person of this demographic uses the toilet in a single instance and/or how many instances of use are typical within a given range of time).

If the toilet usage is within the expected range, the usage may be logged (block 1606) and the process may iteratively restart periodically (block 1606). This may also include refraining from providing a notification of the use (e.g., unless explicitly requested).

If the toilet usage is not within the expected range, the unexpected usage is logged (block 1608). This may include logging the usage along with an indication of the usage falling outside of a particular threshold range.

An electronic device pre-defined to receive notifications related to unexpected usage is identified (block 1610) and an electronic notification is provided to the electronic device, indicating the unexpected usage (block 1612).

Smart Mirror/Scale

Figure 17:
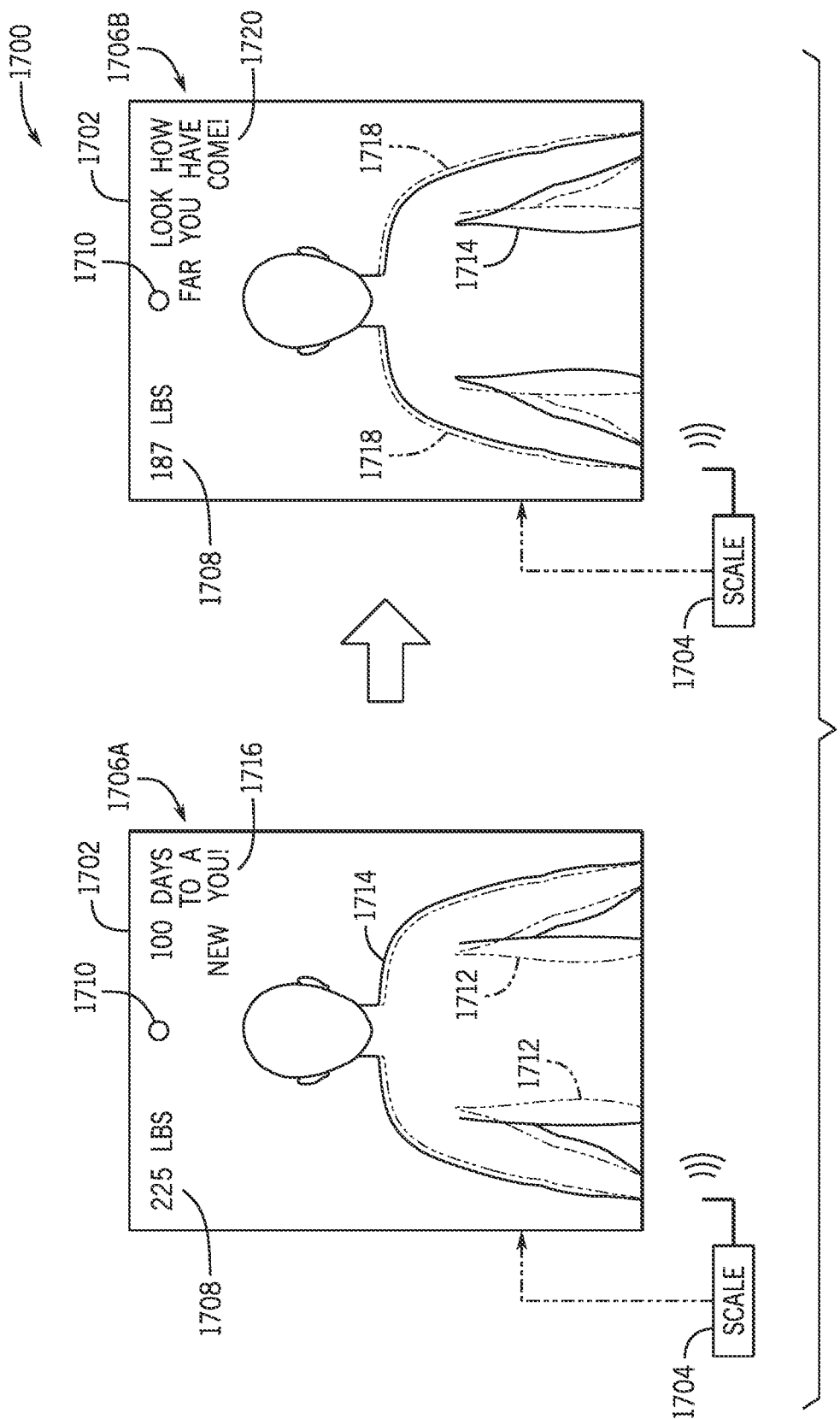
FIG. 17 illustrates a smart mirror and a smart scale, in accordance with embodiments described herein.

FIG. 17 illustrates a progression 1700 of a smart mirror 1702 and a smart scale 1704, in accordance with embodiments described herein. As illustrated in progression 1706A, the smart mirror 1702 may display a weight indication 1708. The smart mirror 1702 may detect that the communicated weight exceeds a recommended weight for the characteristics of the user of the mirror 1702 (e.g., based on characteristics captured via a camera 1710 of the smart mirror 1702). In response to this detection, the smart mirror may provide an overlay profile 1712 over a reflection 1714 of the user of the mirror 1702. A motivational notice 1716 indicating a goal time period (e.g., calculated based upon a goal weight change divided by a healthy rate of change) is displayed.

In progression 1706B, after a time period, changes may be acknowledged and displayed by the mirror 1702. For example, as the smart scale 1704 communicates a positive change towards a goal, an overlay profile and/or translucent past image 1718 may be overlain on a reflection 1714. A success message 1720 may also be displayed.

Figure 18:
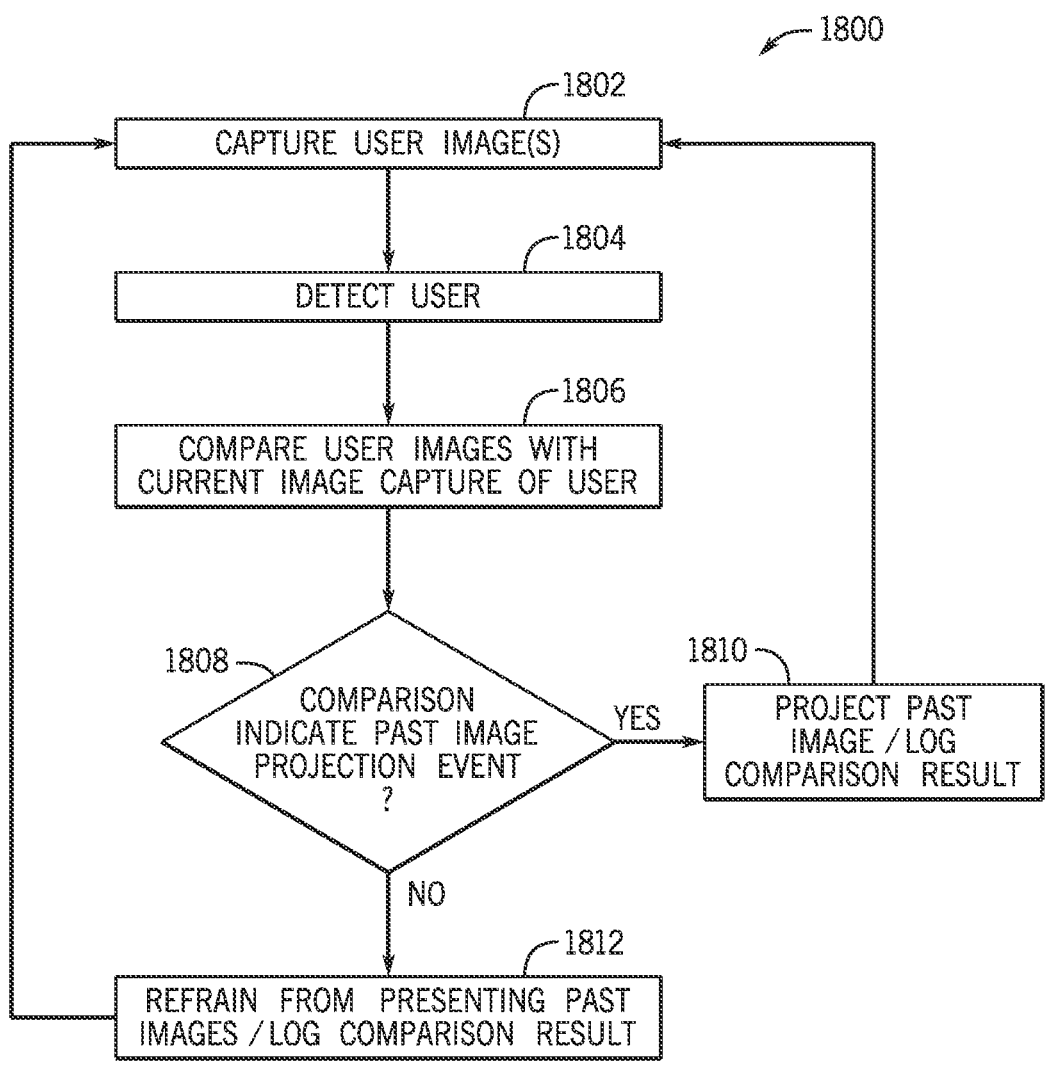
FIG. 18 illustrates a flowchart of a process for displaying projections in a smart mirror, in accordance with embodiments.

FIG. 18 illustrates a flowchart of a process 1800 for displaying projections in a smart mirror, in accordance with embodiments. The process 1800 begins with capturing user images (block 1802). For example, as illustrated in progression 1706A, the smart mirror 1702 may include a camera 1710 that may capture images reflected by the mirror 1702.

Upon detecting a user (block 1804), a comparison of user images with the current image captured is performed to identify a level of change (block 1806). Based upon the comparison, a determination is made as to whether the comparison indicates a past image projection event should be triggered (decision block 1808). This may occur when the comparison of images show a threshold level of change between image (e.g., over a 1-inch reduction in body width).

If the comparison indicates a past image projection event, a past image is projected and the comparison result may be logged (block 1810). However, if a past image projection is not indicated by the comparison, the mirror 1702 refrains from projecting past images, but may still log the comparison result (block 1812).

Figure 19:
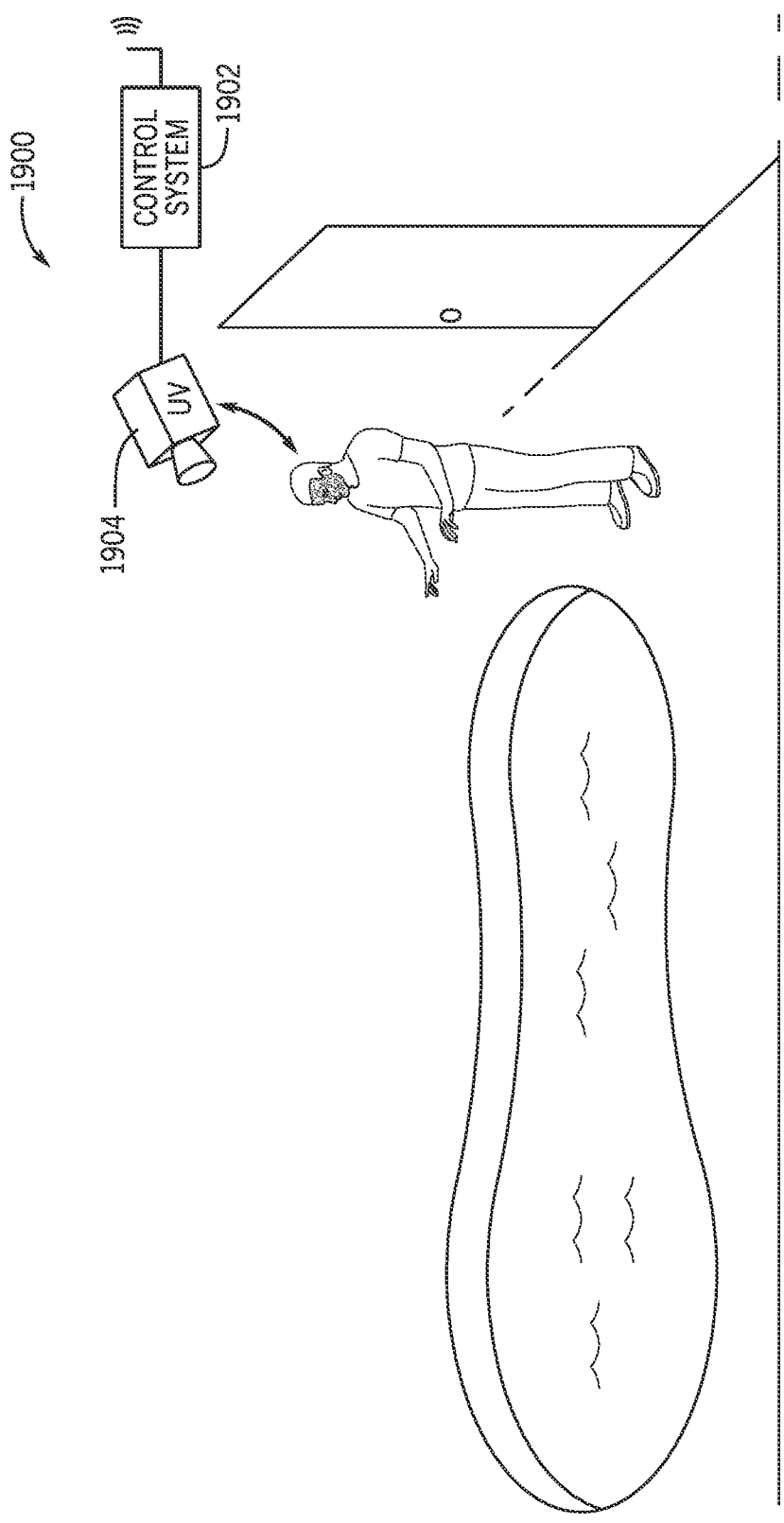
FIG. 19 illustrates a sunscreen detection system, in accordance with embodiments described herein.
Figure 20:
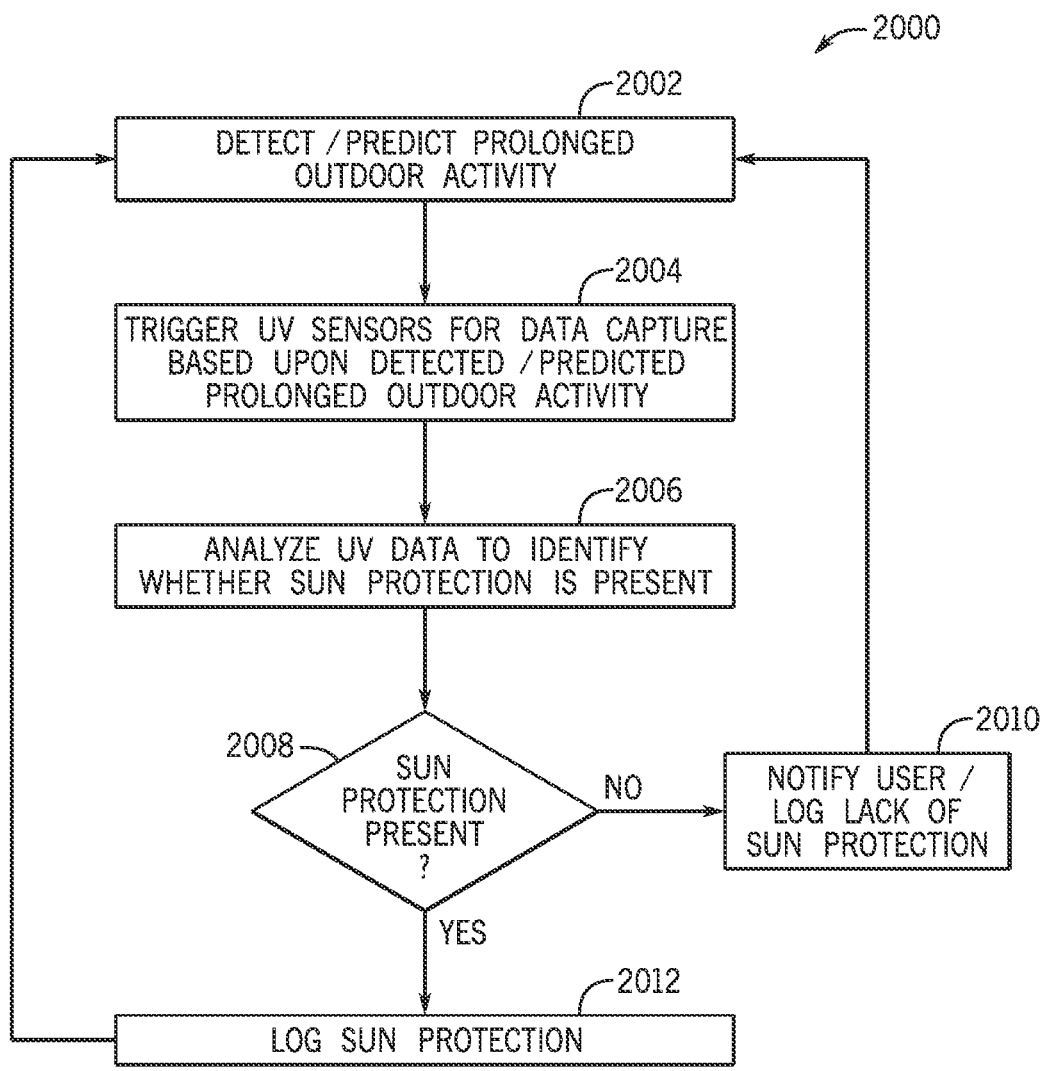
FIG. 20 illustrates a flowchart of a process for detecting sunscreen application, in accordance with embodiments.

FIG. 19 illustrates a sunscreen detection system 1900 and FIG. 20 illustrates a flowchart of a process 2000 for detecting sunscreen application, in accordance with embodiments. For simplicity these will be discussed together.

As illustrated, the sunscreen detection system 1900 includes a control system 1902 that controls an ultraviolet (UV) camera 1904. Upon detecting and/or predicting prolonged outdoor activity (block 2002) of a user, the control system 1902 may trigger the UV camera 1904 to capture data based upon the detected and/or predicted prolonged outdoor activity (block 2004).

The captured UV data may be analyzed to identify whether sun protection is present (block 2006). For example, contrast in captured data may indicate particular areas where sun protection has not been applied and/or has worn off.

When sun protection is not present (decision block 2008), a user is notified (e.g., via a message sent to an electronic device) that the sun protection is not present and this lack of sun protection is logged (block 2010). When sun protection is present (decision block 2008), the sun protection is logged (block 2012).

While only certain features of disclosed embodiments have been illustrated and described herein, many modifications and changes will occur to those skilled in the art. It is, therefore, to be understood that the appended claims are intended to cover all such modifications and changes as fall within the true spirit of the present disclosure.

The invention claimed is:

1. A system, comprising:
an object disposed in a bathroom;
a non-intrusive sensor configured to preserve privacy by capturing sensor data corresponding to an activity performed on the object by an occupant of the bathroom without capturing image data, video data, or audio data, wherein the activity performed on the object is different than an actuation of the non-intrusive sensor;
a storage device communicatively coupled to the non-intrusive sensor configured to:
receive an electronic indication of the sensor data; and
maintain a log of an accumulation of the sensor data over time;
a data analysis service configured to:
receive the accumulation of the sensor data over time;
determine, from the accumulation of the sensor data over time, a pattern corresponding to the activity associated with the object; and
provide an indication of the pattern to a service tasked with personalizing the service based upon the activity.

2. The system of claim 1, wherein the non-intrusive sensor comprises a piezo sensor comprising a piezoelectric sensor, a piezoresistive sensor, or both configured to identify compression, expansion, or both of the object, wherein the compression, the expansion, or both indicates the activity.

3. The system of claim 2, wherein the object comprises a toothpaste container and the piezo sensor is disposed:
as a mesh in one or more sides of the toothpaste container to identify compression of the toothpaste container;
in a toothpaste outlet of the toothpaste container to identify a pressure caused by output of toothpaste from the toothpaste container; or
both.

4. The system of claim 3, wherein the storage device is disposed in a rigid portion of the toothpaste container, comprising a portion of the toothpaste outlet, an end portion of the toothpaste container, or both.

5. The system of claim 2, wherein the object comprises a dispenser, comprising a floss dispenser, a medicine dispenser, or both and the piezo sensor is affixed to a hinge of the dispenser to detect the activity comprising opening, closing, or both a lid of the floss dispenser.

6. The system of claim 1, wherein the non-intrusive sensor comprises a motion sensor configured to detect rotational movement of at least one portion of the object.

7. The system of claim 6, wherein the motion sensor comprises an accelerometer.

8. The system of claim 7, wherein the object comprises:
a floss dispenser and the at least one portion of the object comprises a floss spool;
a toilet paper roll holder and the at least one portion of the object comprises a spindle of the toilet paper roll holder; or
both.

9. The system of claim 6, wherein the object comprises:
a toilet and the at least one portion of the object comprises a flush handle;
a faucet and the at least one portion of the object comprises a faucet cartridge; or
both.

10. The system of claim 1, comprising:
an electronic notification device, configured to:
when the pattern is not as expected, provide, a notification that the pattern is not as expected; and
otherwise, when that pattern is as expected, refrain from providing the notification.

11. The system of claim 10, wherein the activity comprises accessing a substance container.

12. The system of claim 11, wherein the non-intrusive sensor comprises a compression sensor disposed within a safety cap of the substance container, configured to capture compression of the safety cap, indicating access to an inside of the substance container via the safety cap.

13. The system of claim 11, wherein the data analysis service is configured to identify that an unexpected compartment of the substance container was opened, based upon the unexpected compartment being associated with a particular day that does not match a day that the access to the unexpected compartment occurred.

14. The system of claim 11, wherein the data analysis service is configured to identify that an unexpected amount of substance has been withdrawn from the substance container based upon a differential between a pre-withdrawal weight and a post-withdrawal weight not matching an expected weight corresponding to an expected dosage of the substance.

15. The system of claim 1, wherein the non-intrusive sensor and the storage device are part of the object.

16. A tangible, non-transitory, computer-readable medium, comprising computer-readable instructions that, when executed by one or more processors of one or more computers, cause the one or more computers to:
receive an electronic indication of sensor data from a non-intrusive sensor without capturing image data, video data, or audio data, the sensor data corresponding to an activity performed on an object disposed in a bathroom by an occupant of the bathroom, wherein the activity performed on the object is different than an actuation of the non-intrusive sensor;
maintain an electronic log of the sensor data; and
provide an indication of the electronic log to a service tasked with personalizing the service based upon the activity.

17. The tangible, non-transitory, computer-readable medium of claim 16, comprising computer-readable instructions that, when executed by the one or more processors of the one or more computers, cause the one or more computers to:
identify whether the activity is expected;
provide a notification, via an electronic notification device, when the activity is unexpected; and
otherwise, refraining from providing the notification when the activity is expected.

18. The tangible, non-transitory, computer-readable medium of claim 17, wherein the object comprises a substance container, the tangible, non-transitory, computer-readable medium comprising computer-readable instructions that, when executed by the one or more processors of the one or more computers, cause the one or more computers to:
identify that an unexpected compartment of the substance container was opened, based upon the unexpected compartment being associated with a particular day that does not match a day that an access to the unexpected compartment occurred; and
identify the opening of the unexpected compartment as an unexpected activity; and
providing the notification based upon identifying the opening of the unexpected compartment as an unexpected activity.

19. The tangible, non-transitory, computer-readable medium of claim 17, wherein the object comprises a substance container, the tangible, non-transitory, computer-readable medium comprising computer-readable instructions that, when executed by the one or more processors of the one or more computers, cause the one or more computers to:
identify a weight of a recommended dosage of a substance contained in the substance container;
identify a differential in weight between pre-withdrawal of the substance from the substance container and a post-withdrawal of the substance from the substance container;
identify withdrawal of an unexpected amount of the substance based upon the differential in weight breaching a threshold level of difference of the weight of the recommended dosage;
identify the withdrawal of the unexpected amount as an unexpected activity; and
providing a notification based upon identifying the withdrawal of the unexpected amount as an unexpected activity.

20. A computer-implemented method, comprising:
receiving an electronic indication of sensor data from a non-intrusive sensor without capturing image data, video data, or audio data, the sensor data corresponding to an activity performed on an object disposed in a bathroom, wherein the activity performed on the object is different than an actuation of the non-intrusive sensor;
maintaining an electronic log of the sensor data; and
providing an indication of the electronic log to a service tasked with personalizing the service based upon the activity.

* * * * *